United States Patent [19]

Heim

[11] 4,053,096
[45] Oct. 11, 1977

[54] THERMOCOMPRESSION WELDING DEVICE

[75] Inventor: Richard Heim, Moosburg, Germany

[73] Assignee: Texas Instruments Deutschland GmbH, Freising, Germany

[21] Appl. No.: 699,915

[22] Filed: June 25, 1976

[30] Foreign Application Priority Data

June 27, 1975 Germany ............................ 2528806

[51] Int. Cl.² ......................................... H01L 21/603
[52] U.S. Cl. ................................. 228/4.5; 228/180 A
[58] Field of Search .................... 228/4.5, 179, 180 A

[56] References Cited

U.S. PATENT DOCUMENTS 3,376,635  4/1968  Moesker ................................ 228/179
3,941,298  3/1976  Nicklaus .............................. 228/180 A

Primary Examiner—Robert C. Watson

Attorney, Agent, or Firm—Harold Levine; Richard L. Donaldson; James T. Comfort

[57] ABSTRACT

A thermocompression welding device including a welding head having two tools for automatically and simultaneously effecting welds between a connecting wire and a pair of contact areas, one on a semiconductor chip and one on a housing for the chip. The weld head is transversed between consecutive weld positions using an X-Y table. The apparatus provides automatic adjustment of connecting wire length, and matched automatic adjustment of weld head separation, corresponding to different contact area spacings and automatic orientation of the welding head to correspond to different orientations of the pairs of contact areas. Preprogrammed lengths of wire are fed to the welding head from a continuous coil and bent into position for simultaneous engagement by both welding tools, the wire being severed adjacent one of the welds immediately following each welding operation.

17 Claims, 13 Drawing Figures

THERMOCOMPRESSION WELDING DEVICE

The invention relates to a thermocompression welding device for welding a connecting wire between a contact area of a semiconductor wafer and a matching contact area of a housing, with a welding capillary, from the mouth of which the connecting wire emerges, and which can be set down on one of the contact areas.

With the aid of such a welding device, weld connections can be produced between contact areas on a semiconductor wafer and matching contact areas on a housing to contain the semiconductor wafer, in that first the connecting wire protruding from the mouth of the welding capillary is welded to one contact area, then the welding capillary is lifted off the contact area and, while pulling the connecting wire out of the mouth, is guided to the other contact area, onto which the welding capillary is then lowered, whereupon the connecting wire protruding from the mouth is welded to this other contact area. For making a connection between two contact areas, therefore, two consecutive welding operations must be carried out. Between these welding operations, a relative movement between the welding capillary and the contacting points must take place.

The making of connections between contact areas, especially in semiconductor components having a relatively large number of contact areas, for example in integrated circuits, is a time-consuming operation, which takes a significant part of the total production time of such a semiconductor component.

It is the object of the invention to design a thermocompression welding device of the above stated kind so that the time required for making the connections between contact areas on a semiconductor wafer and on a housing is greatly reduced.

According to the invention, this is achieved by a welding tool which is provided spaced from the welding capillary by the distance of the contacting points and which can be set down on the other contact area.

In the welding device according to the invention, it is possible by means of the welding tool to produce, simultaneously with the production of the weld connection at the contact area on which the welding capillary acts, also the weld connection at the contact area on which the welding tool can be set down. Both welding operations thus occur simultaneously, and no relative movement needs to be carried out between the welding capillary and the contact areas. The bonding of connecting wires between contact areas of a semiconductor component can thus be greatly accelerated.

Preferably the distance between the welding capillary and the welding tool is variable, so that connections between differently spaced contact areas also can be produced.

As the contact areas on the semiconductor wafer and the matching contact areas on the housing need not necessarily be at the same level, the welding capillary and the welding tool are preferably displaceable relatively to each other in the direction of setting down.

In semiconductor wafers with a relatively large number of contacting points, the direct connections between the respective contact areas on the semiconductor wafer and the matching contact areas on the housing extend in different directions with respect to an initial direction in a connection sequence. To produce connections between such contact areas lying in different directions, the welding device according to the invention is preferably designed so that the welding capillary and the welding tool are provided on a welding head which is rotatable about a vertical axis, preferably the center axis of the welding capillary.

According to an advantageous embodiment, the welding device according to the invention comprises a wire feed device for supplying the connecting wire to the welding capillary. Also there is preferably provided a bending device for bending the connecting wire protruding from the mouth of the welding capillary toward the welding tool.

By say of example an embodiment of a welding device incorporating the invention will be described in greater detail with reference to the drawings, wherein.

Figure 1:
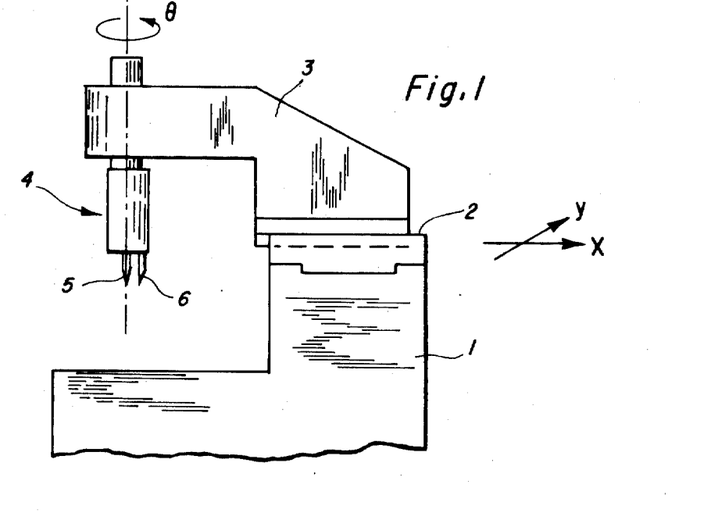
FIG. 1 shows a simplified overall view of a thermocompression welding device embodying the invention.
Figure 8:
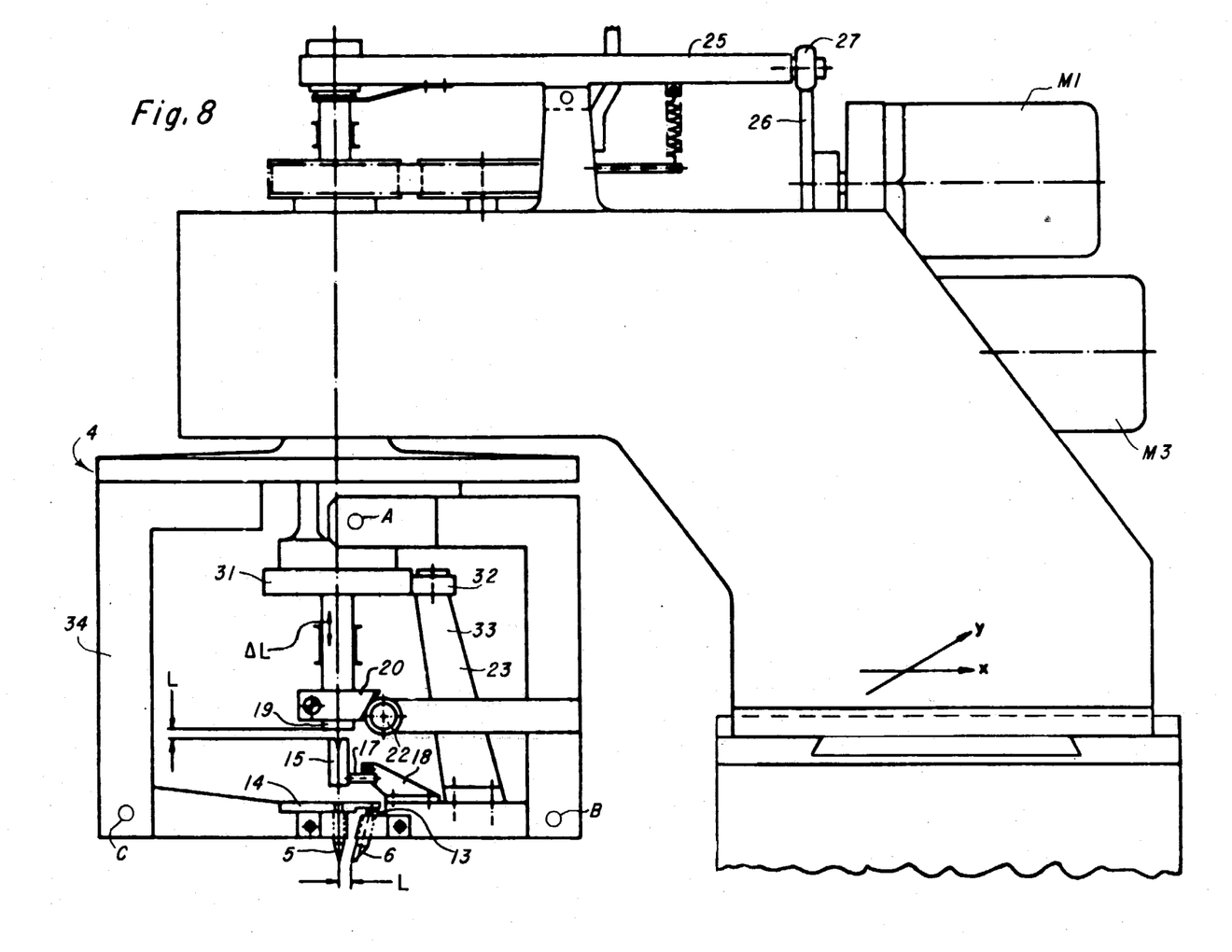
FIG. 8 is a detailed overall view of a preferred embodiment of the welding apparatus shown in FIG. 1.

The thermocompression welding device illustrated by FIGS. 1 and 8 includes a machine base 1, which on an X-Y table 2 carries a holding arm 3 displaceable in the horizontal plane. At the free end of the hold arm 3 is a welding head 4 which is provided at its lower end with a welding capillary 5, as used in the known nail-head contacting technique. The welding head 4 is mounted on the holding arm 3 for rotation about the center axis of the welding capillary 5.

There is further provided on the welding head 4 a welding tool 6, whose distance from the welding capillary can be varied, and comprises a metal body converging downwardly to a press-on chisel edge.

Figure 2:
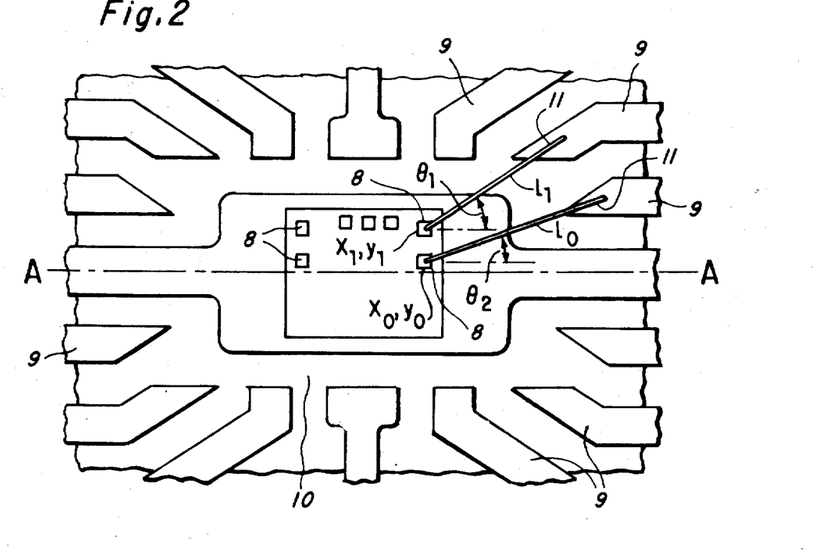
FIG. 2, a greatly enlarged inside view of a semiconductor component showing the contact areas to be connected.

To illustrate the operation of the welding device here to be described, reference is made to FIG. 2, in which is shown an inside view of a semiconductor component, in the production of which the welding device is to be used. The core piece of the semiconductor component is a semiconductor wafer 7, in which an integrated circuit is formed by known methods. For making external connections to this integrated circuit contact areas 8 are provided on the surface of the semiconductor wafer 7. To complete the semiconductor component, these contact areas 8 must be electrically connected with matching contact areas 9 on the housing 10 surrounding the semiconductor wafer 7.

These electrical connections are made between the contact areas 8 on the semiconductor wafer and those, 9, on the housing 10 by connecting wires 11 which, as can readily be seen from FIG. 2, have a different length *l* and extend at different angles 0 to a given reference direction A—A.

The construction of the welding capillary 5 provided at the welding head 4 and of the welding tool 6 as well as of the elements necessary for their actuation are shown in FIG. 8 and, more diagrammatically, in FIGS. 3–6. A tool-holder 12 establishes the connection between the welding head 4 and the welding tool 6 as well as the welding capillary 5. When the tool holding arm 12 carries out in the welding head 4 a lifting or lowering movement, the welding tool 6 is moved up or down in like manner.

At the tool holder 12 an abutment 13 is provided, which cooperates with one end of a driver arm 14, which carries at its other end the welding capillary 5. As a result of engagement of abutment 13 and driver arm 14, the welding capillary 5 as well as the welding tool 6 is raised or lowered with the tool holder 12.

The connecting wire to be welded to the contact areas of the semiconductor component and of the housing is supplied to the welding capillary by means of a wire feed device, in the illustrated example a clamping device 15, which in an open position allows the connecting wire to pass freely, while tightly clamping the wire in a closed position. Normally, the clamping device 15 is urged upward by a compression spring 16 which acts on the underside of a driver arm 17 projecting laterally from the clamping device 15. In the path of movement of the driver arm 17 lies a stop 18 secured to the tool-holder 12. In the movement path of the clamping device 15 lies a wire length stop 19. Depending on whether in the currently existing state of operation, the stop 18 or the wire length stop 19 occupies a lower position, the upwardly directed movement of the clamping device 15, brought about by the compression spring 16, is limited by the stop 18 or by the wire length stop 19. The vertical distance $d$ of the wire length stop 19 from stop 18 (FIG. 5) determines the length of the wire protruding from the welding capillary 5.

The height of the wire length 19 is adjustable, so that the upwardly directed movement of the clamping device 15 can be limited at different height positions. When the height of the wire length stop 19 is changed, a coupling device 20 provided between the wire length stop 19 and the tool-holder 12 brings about a lateral displacement of the tool-holder 12 and hence of the welding tool 6 by reason of the cooperating surfaces 20A and 12A. In the FIG. 8 embodiment, cooperation between the surfaces 20A and 12A swings the welding tool about the pivot point A. Since the welding capillary 5 is not affected by this lateral movement, the distance between it and the welding tool 6 changes. The coupling device 20 is so designed that the amount of the lateral displacement of the tool-holder 12 caused by it is fixed as a function of the height to which the wire length stop 19 is set.

Figure 7:
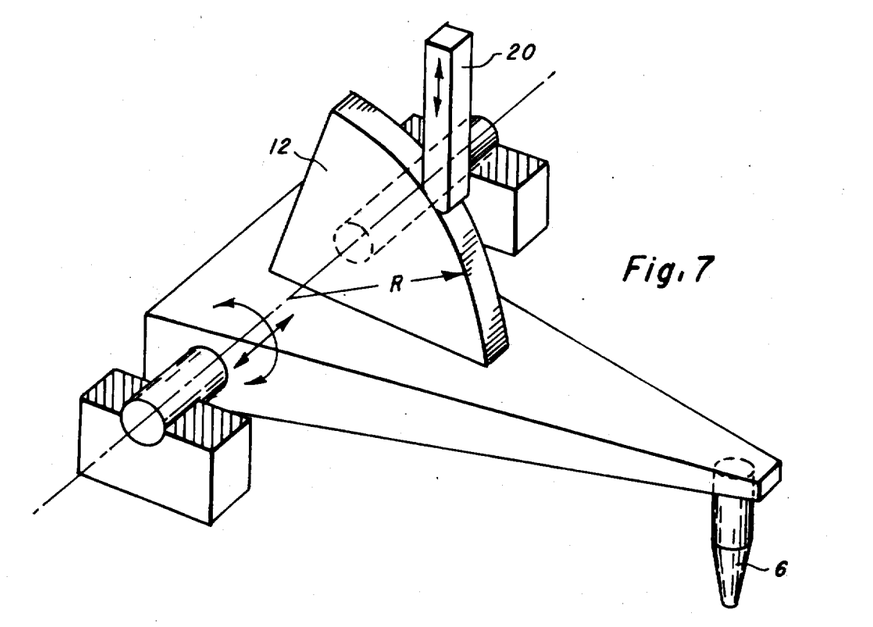
FIG. 7 is a functional illustration of the manner in which lateral displacement of the welding tool relative to the welding capillary is effected.

As better shown in the FIG. 7 detail, the coupling device 20 has an inclined surface 20A that engages with an arcuate surface 12A of the tool-holder 12 so that vertical movement of the coupling device 20 displaces the welding tool 6 towards and away from the welding capillary 5.

On the welding head 4 there is provided also a bending mandrel 21, whose function it is to bend the connecting wire protruding from the welding capillary 5 in the direction of the welding tool 6 so that the end of the connecting wire 11 comes to lie under the welding tool 6. The connecting wire 11 is then bent by the bending mandrel 21 so that it extends between the welding capillary 5 and the welding tool 6 in an upwardly arched loop. For the reliable guiding and fixing of the connecting wire 11 to under the welding tool 6 and after in the bending operation, a guiding device 50 may be provided at the welding tool 6, which reliably brings the wire into position as it approaches the welding tool 6 and also holds the wire in position until it is bonded. Also the welding tool 6 itself may be provided with guide faces, which seize the wire and center it in a central position with respect to the welding tool.

With reference to FIGS. 3 to 6 there is now given a precise description of the operations taking place in the course of the welding on of a connecting wire 11 between the contact areas 8 of the semiconductor wafer and the matching contact areas 9 on the housing of the semiconductor component.

Figure 3:
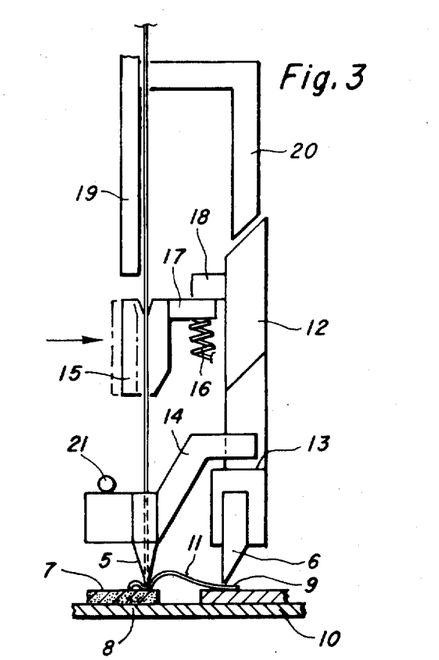
FIGS. 3 to 6, show different operating positions of the welding capillary and welding tool provided on the welding head in a preferred embodiment of the invention.

In FIG. 3 are shown the parts of the welding device in the position which they occupy in the welding of a connecting wire 11 to the contact areas 8 and 9. In this phase, the welding capillary and welding tool 6 are located precisely at the contact areas. The clamping device 15 is closing and the driver arm 17 is held by the compression spring 16 against the stop 18 of the tool-holder 12. The driver arm 14 lies at a predetermined distance above the abutment 13.

Figure 4:
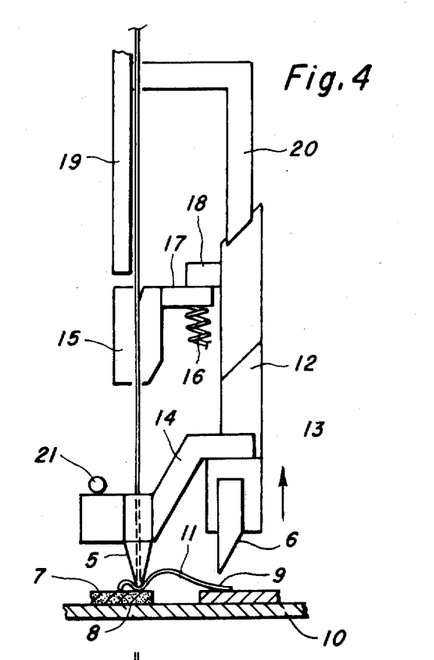

The tool-holder 12 now begins to move upward (in the embodiment of FIGS. 8 and 9 pivoting upward about pivot B), so that the welding tool 6 lifts off the contact area 9 with which it has cooperated. At the same time also the clamping device 15 moves upward under the effect of the compression spring 16 and tears the connecting wire 11 off at the contact area 8. In order that this tearing off process can take place as far as possible without load stress on the welded connection just made, the welding capillary 5 still remains, due to the distance between the driver arm 14 and the abutment 13, in contact with the contact area 8 as the tool-holder 12 initially rises; the actual welding point at the edge of the welding capillary 5 therefore has no load applied to it during the tearing off of the connecting wire. This intermediate phase of the upwardly directed movement of the tool-holder 12 is shown in FIG. 4.

Figure 5:
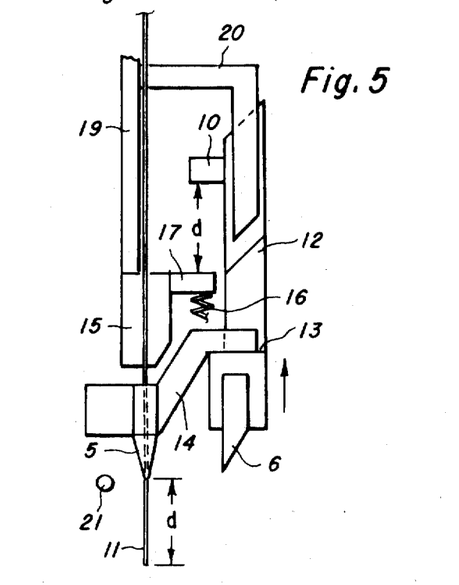

During the further lifting of the tool-holder 12, after engagement of the abutment 13 and the driver arm 14, finally also the welding capillary 5 is lifted off the contact area 8 and moved upward. In the course of the lifting movement, and clamping device 15 strikes against the wire length stop 19, so that it no longer follows the further upward movement of the tool-holder 12. The welding capillary 5, instead, is lifted further, so that the distance between the clamping device 15 and the welding capillary 5 diminishes. This causes the connecting wire 11 retained by the clamping device 15 to emerge from the mouth of the welding capillary 5. In FIG. 5, in which the tool-holder 12 is shown at the upper end of its lift movement, it can be seen that the length $d$ of the connecting wire that has emerged from the welding capillary corresponds exactly to the distance by which the tool-holder 12 has been lifted further after the clamping device 15 has struck against the wire length stop 19. By varying the height of the wire length stop 19, therefore, the wire length which protrudes from the welding capillary 5 at the end of the lift movement of the tool-holder 12 can be selected and established. The lower the wire length stop 19 is set, the longer will be the wire protruding from the welding capillary 5.

Figure 9:
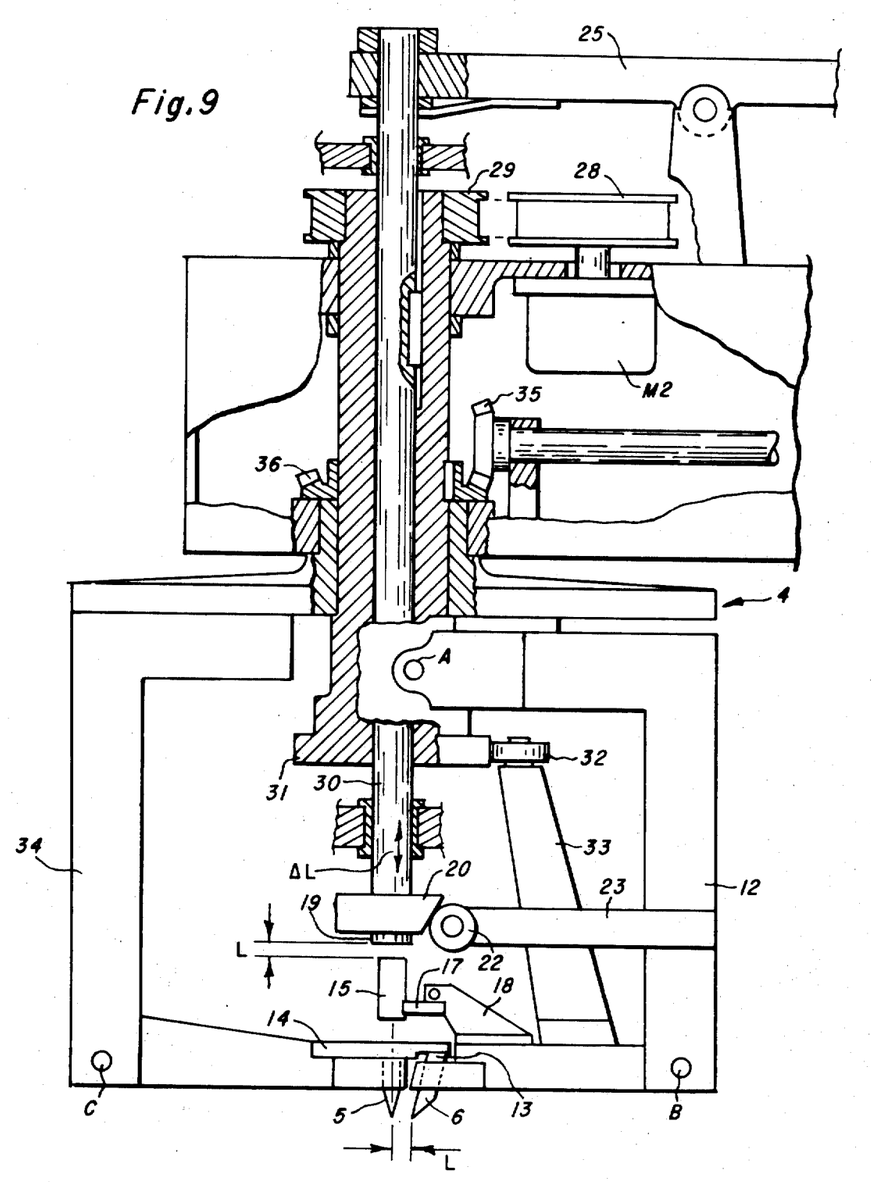
FIG. 9 is a section along the line 9—9 of FIG. 8.
Figure 10:
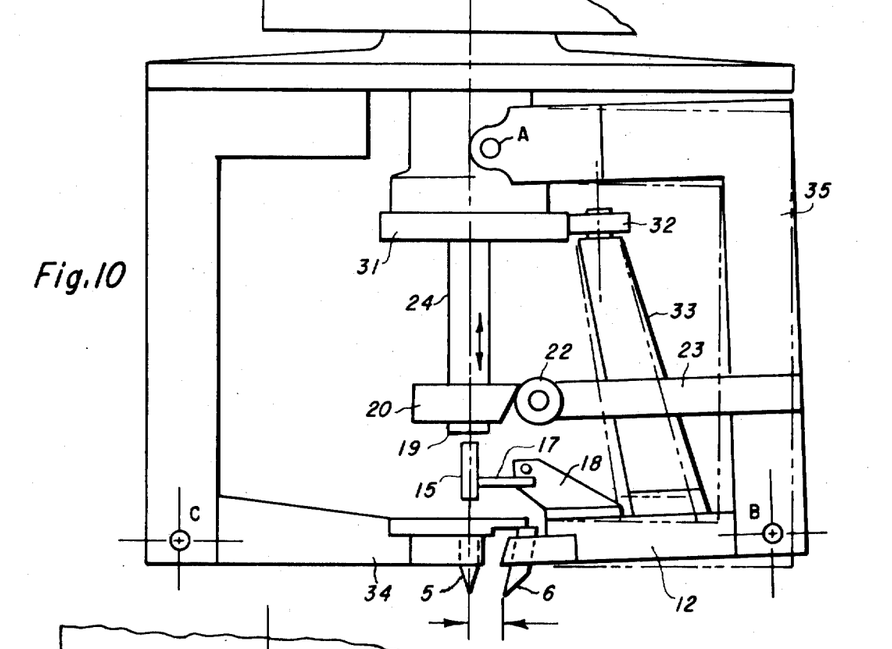
FIGS. 10 and 11 are illustrations of the welding head shown in FIG. 8 depicting the manner of operation thereof.

Simultaneously with the setting of the height of the wire length stop 19, the distance between the welding capillary 5 and the welding tool 6 is varied by means of the coupling device 20. In the embodiment of FIGS. 8 and 9, the device 20 has an inclined surface which engages with a roller 22 on an arm 23 fixed to a member 35 to which the tool carrier 12 is pivoted to swing the carrier 12 about a pivot point A, thereby adjusting the lateral separation of the weld tool 6 from the weld capillary 5. The device 20 is carried by a shaft 24, vertical movement of which is effected by a pivoted arm 25 coupled to a drive motor M1, by a cam 26 which engages a cam follower 27 on the arm 25. This lateral adjustment of the distance between the welding capillary 5 and the welding tool 6 is further illustrated by FIG. 10. This distance is in direct proportion to the length of the respective wire piece protruding from the welding capillary, as will be explained with reference to the following description.

After the wire piece necessary for the next welding operation now protrudes from the welding capillary, the bending mandrel 21 according to the schematic view of FIG. 6 pivots about the mouth of the welding capillary 5 so that the connecting wire 11 is bent toward the welding tool 6 until the wire comes to bear against the press-on edge of the welding tool from below. The above mentioned guide devices may be provided to ensure that the wire comes to lie exactly under the center of the welding tool 6. In order that at different wire lengths the end of the connecting wire will always come to lie under the press-on edge of the welding tool, the distance between the welding capillary 5 and the welding tool 6 also must be set simultaneously with the setting of the respective wire lengths, as has been mentioned above. After the bending operation, the bending mandrel pivots back to its starting position.

Utilizing its plastic properties, the connecting wire can be formed in nearly any desired way by means of the bending mandrel. By the arcuate form and preforming of the connecting wire between the welding capillary 5 and the welding tool 6, as shown in FIGS. 3 and 6, it is achieved that the wire can be welded on stress-free. Also because of wire forming by a tool, looping problems such as wire sagging and loop height variation are eliminated.

Figure 6:
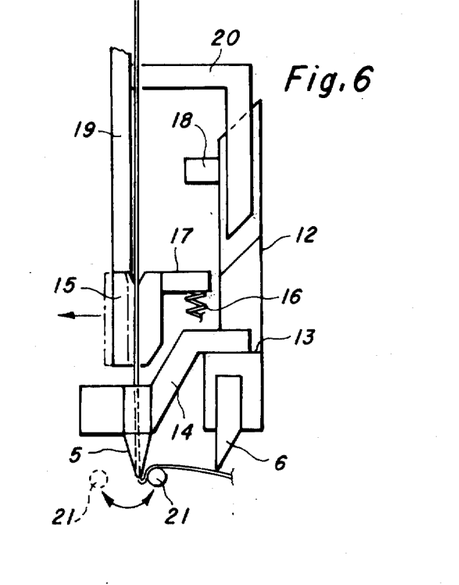
Figure 11:
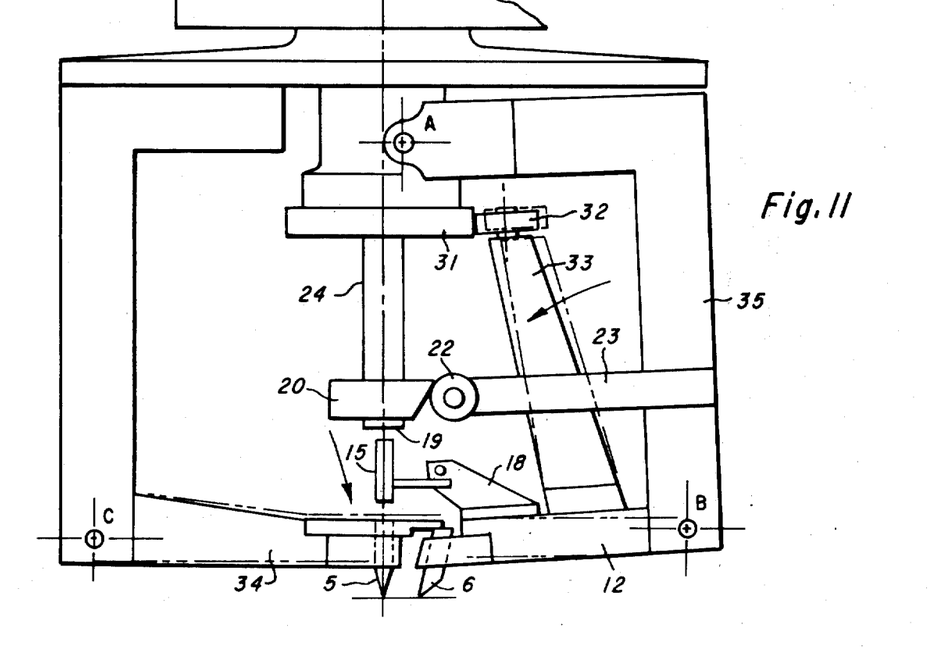

When the connecting wire according to FIG. 6 extends between the welding capillary 5 and the welding tool 6, the tool holder 12 can be lowered again. As the lowering movement begins, the clamping device 15 opens so that the wire can be pulled downward by the welding capillary 5. In the embodiment of FIGS. 8 and 9, the lowering movement is pivotal and is effected by a drive motor M2 coupled by pulleys 28, 29 to rotate a shaft 30. A cam 31 carried by the shaft 30 engaged by a follower 32 carried by an arm 33 fixed to the tool carrier 12, causes the latter to pivot about a pivot point B and causes a tool carrier 34, carrying the welding capillary 5 to pivot about a pivot point C. thereby lowering the welding capillary 5 and welding tool 6 as the arm 33 swings anticlockwise. This lowering movement is further illustrated by FIG. 11.

In the course of the movements described until now, also the X-Y table on which the semiconductor component is located has moved so that the welding capillary 5, after having been lowered, hits exactly on a contact area 8. During the lifting and lowering movement of the tool-holder 12, the welding head 4 is also rotated in such a way that the connecting wire 11 extending from the welding capillary 5 to the welding tool 6 runs exactly in the direction of the direct connection between the next contact area 8 on the semiconductor wafer and the next contact area 9 on the housing. This rotation is effected by a motor M3, the drive shaft of which is coupled to the welding head 4 by bevel gears 35, 36 (see FIGS. 8 and 9).

Figure 12:
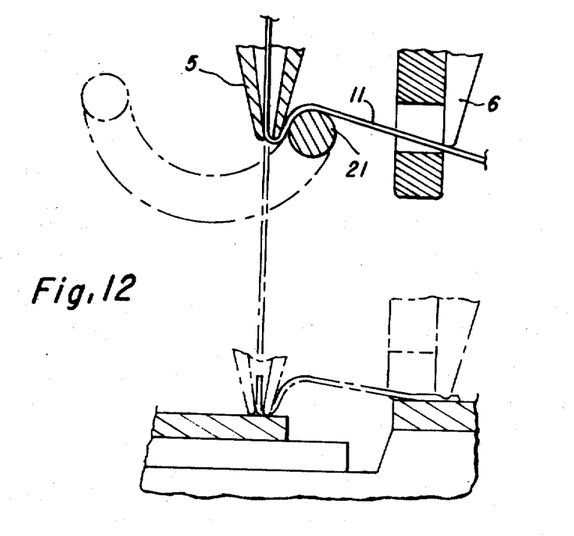
FIG. 12 is a detailed enlargement showing operation of a wire bending tool in the FIG. 8 apparatus.
Figure 13:
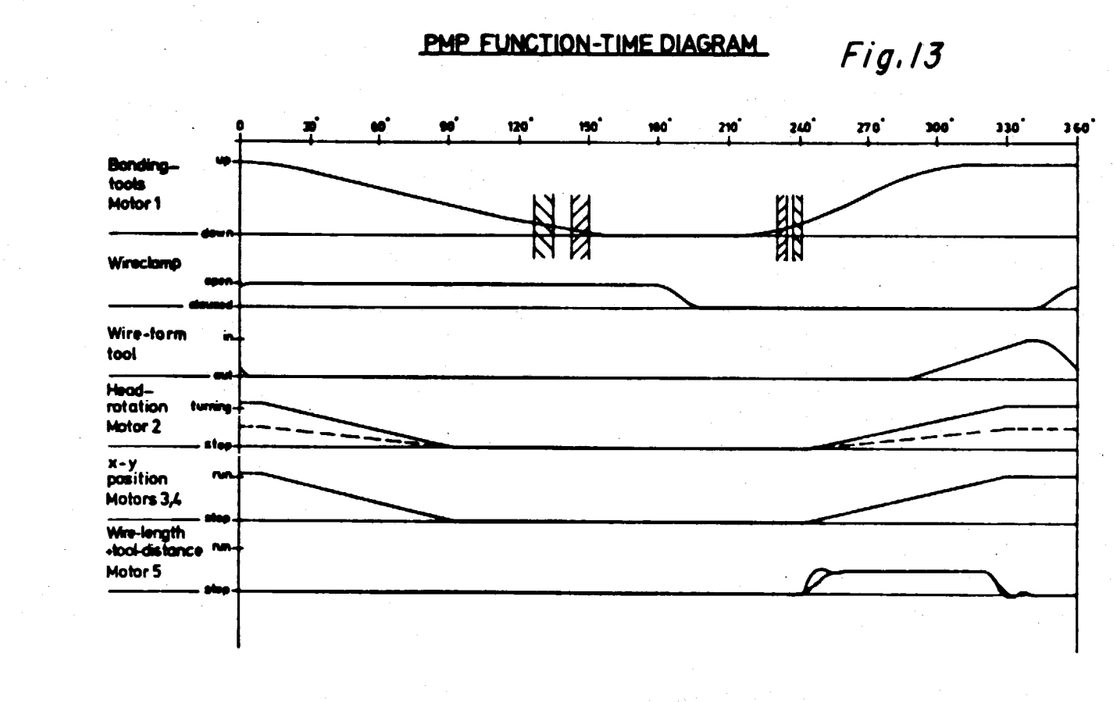
FIG. 13 is a function-time diagram illustrating operation of various parts of the welding apparatus during an operating cycle.

The operating cycle of the welding apparatus described above is further illustrated by the function-time diagram of FIG. 12.

It will be appreciated that the abovedescribed embodiment of the invention eliminates the need of a ball-forming process which is known as critical in terms of settings and varying ball sizes. Also the connecting wire loop is formed by a tool eliminating all loop-related problems of conventional machines and the wire is torn off without stressing the bond just made.

As the weld joint produced by the welding capillary 5 lies, not exactly at the axis of the capillary, but at the periphery thereof, which presses the wire against the contact area, provision must be made when adjusting the X-Y table that the weld joint to be produced comes to lie exactly in the center of the contact area. When the welding head is rotated about the center axis of the welding capillary, the X-Y table must therefore be adjusted so that the center of the contact area comes to lie exactly under the peripheral point of the welding capillary at which the weld joint is produced, and not at the axis of rotation of the welding head.

It is possible also, however, to rotate the welding head about an axis which extends through the periphery of the welding capillary, and hence exactly through the weld point to be produced. In this case, the X-Y table must be adjusted so that the center of the contact area coincides with the axis of rotation of the welding head. After setting down on these contact areas, the new weld connection can be produced.

The connection between the welding capillary 5 and the tool holder 12 via a driver arm 14 and a cooperating abutment 13 not only has the above described advantage that the tearing off of the connecting wire after the welding effected by the capillary 5 can occur without load on the weld joint, but it makes possible also the setting down of the welding capillary 5 and of the welding tool 6 on contact areas which are not on the same level. For example, if the contact area 8 on the semiconductor wafer lies higher than the contact area 9 on the housing, then, as the tool holder 12 descends, first the welding capillary comes to bear on the contact area 8, whereupon the tool holder 12 can descend further until the welding tool 6 rests on the contact area 9 on the housing.

The above described movement cycles are repeated in the course of the production of the semiconductor component until all contact areas 8 of the semiconductor wafer are connected to corresponding contact areas 9 on the housing by connecting wires 11. The specifically described movements of the individual parts, of course, are not such that one sequence begins only after the movement sequence of another part is completed, but to the extent possible they occur simultaneously. This contributes to significantly increasing the speed of the entire welding process. Further it is possible to carry out all movement sequences connected with the welding of the connecting wires fully automatically under control by a computer. For this purpose, for example, the semiconductor component may be scanned before the welding operations with respect to the position of the contact areas, and the data derived therefrom can be stored. The data obtained can then be used to position the X-Y table, to rotate the welding head, and to set the height of the wire length stop with the fixing connected therewith of the distance between the welding capillary 5 and the welding tool 6.

It is possible also to carry out the scanning of the contact areas and the storing of the data derived therefrom in a scanning station provided before the actual welding station, simultaneously with the welding operation on a previously scanned semiconductor component. Due to this simultaneous occurrence of the scanning and welding operations, a further reduction of the total time needed for the completion of the semiconductor component can be achieved.

I claim:

1. Thermocompression welding apparatus for welding areas between a contact area of a semiconductor body and a corresponding contact area of a housing for said semiconductor body, including a welding capillary from the mouth of which the contacting wire emerges for application by said capillary to one of said contact areas to effect a weld between said one contact area and said connecting wire, the improvement comprising a separate welding tool laterally displaced from said welding capillary by a distance corresponding to the separation of said contact areas and means for moving said welding capillary and said welding tool through a path movement toward and away from said contact areas for applying said welding capillary and said welding tool simultaneously to engage said connecting wire against the two respective contact areas and to weld said connecting wire to said contact areas.

2. Apparatus according to claim 1 including means for selectively adjusting the lateral displacement of said welding capillary and said welding tool to correspond with different contact area separations.

3. Apparatus according to claim 1, further including means for effecting relative displacement between the said welding capillary and the said welding tool in the direction of said path of movement.

4. Apparatus according to claim 1 wherein said welding capillary and said welding tool are carried by a welding head, and means for rotating said welding head about an axis parallel to said path of movement.

5. Apparatus according to claim 4, wherein said means for rotating said welding head is operable to effect rotation thereof about the axis of said welding capillary.

6. Apparatus according to claim 4, including means for displacing said welding head in a plane perpendicular to the center axis of said welding capillary.

7. Apparatus according to claim 4, including toolholder means connecting said welding tool to said welding head, and means connecting said welding capillary and said tool-holder comprising driver arm means fastened to said welding capillary and abutment means on the tool-holder engageable with said driver arm means.

8. Apparatus according to claim 1, including wire feed means for supplying said connecting wire to said welding capillary.

9. Apparatus according to claim 8, wherein said wire feed means comprises clamping device means through which connecting wire passes before said welding capillary, and means for adjusting the distance between said clamping device and said welding capillary.

10. Apparatus according to claim 9, wherein said clamping device is movable over a path of movement defined by two stop means, one of said stop means being movable with said welding capillary in the path of movement thereof to determine the length of connection wire supplied to said welding capillary.

11. An apparatus according to claim 1, further including wire bending means for bending the connecting wire emerging from the mouth of said welding capillary toward said welding tool to facilitiate said simultaneous engagement of said connecting wire against said two contact areas.

12. In thermocompression welding apparatus for successively welding connecting wires between respective pairs of contact areas of a semiconductor body and of a housing for said semiconductor body, including a welding head carrying a welding capillary from the mouth of which the said connecting wire emerges for application against one contact area of a pair of said contact areas by said welding capillary to effect a weld between said connecting wire and the contact area against which it is applied, said welding head further carrying a separate welding tool in laterally spaced relation with said welding capillary, means for orienting said welding head respective to different pairs of said contact areas to align said welding capillary and said welding tool successively with respective pairs of contact areas, means for adjustably feeding prior to each welding step a length of wire from said welding capillary so that a length of connecting wire emerges therefrom corresponding to the separation between the respective pair of contact areas between which the connecting wire is to be welded by said particular welding step, means for automatically adjusting the lateral separation of said welding capillary and said welding tool according to said adjusted connecting wire length, means for bending said length of connecting wire emergent from said capillary towards said welding head in a path of movement towards and away from said pair of contact areas to cause said welding capillary and said welding tool to apply said connecting wire lengths against a pair of contact areas and to effect respective welds therebetween and thereafter to move said welding capillary and said welding tool away from said contact areas and sever the connecting wire adjacent the mouth of said capillary.

13. Apparatus according to claim 12, including a clamping device for feeding the connecting wire to said capillary, said clamping device clamping said wire to effect said severance during initial movement of the welding head away from said contact areas.

14. Apparatus according to claim 12, wherein the said welding tool and the said welding capillary are coupled together by a lost motion linkage for permitting initial movement of the welding tool independently of the welding capillary during movement of the welding head away from said pair of contact areas to which said connecting wire has been welded.

15. Apparatus according to claim 14, wherein said lost motion linkage comprises an arm fixed to and laterally projecting from said welding capillary and engageable by an abutment fixedly secured to said welding tool.

16. Apparatus according to claim 12, wherein said means for adjusting the length of said connecting wire comprises a stop member positionally adjustable in the direction of said path of movement of the welding head and engageable by said clamping device to determine the length of wire that emerges from the welding capillary.

17. Apparatus according to claim 12, wherein said means for adjusting the lateral separation of the welding capillary and the welding tool comprises an inclined surface fixedly secured to said stop member and engageable with an inclined surface of holder means for said welder tool.

* * * * *